(12) United States Patent
Rode et al.

(10) Patent No.: US 9,825,198 B2
(45) Date of Patent: Nov. 21, 2017

(54) METHOD OF PRODUCING A PLURALITY OF OPTOELECTRONIC SEMICONDUCTOR CHIPS, AND OPTOELECTRONIC SEMICONDUCTOR CHIP

(71) Applicant: OSRAM Opto Semiconductors GmbH, Regensburg (DE)

(72) Inventors: Patrick Rode, Regensburg (DE); Lutz Hoeppel, Alteglofsheim (DE); Norwin von Malm, Nittendorf (DE); Stefan Illek, Donaustauf (DE); Albrecht Kieslich, Radebeul (DE); Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 54 days.

(21) Appl. No.: 14/364,099

(22) PCT Filed: Nov. 12, 2012

(86) PCT No.: PCT/EP2012/072403
§ 371 (c)(1),
(2) Date: Jun. 10, 2014

(87) PCT Pub. No.: WO2013/092004
PCT Pub. Date: Jun. 27, 2013

(65) Prior Publication Data
US 2014/0319547 A1 Oct. 30, 2014

(30) Foreign Application Priority Data

Dec. 23, 2011 (DE) .......................... 10 2011 056 993
Feb. 22, 2012 (DE) .......................... 10 2012 101 409

(51) Int. Cl.
*H01L 21/304* (2006.01)
*H01L 21/28* (2006.01)
(Continued)

(52) U.S. Cl.
CPC ........ *H01L 31/1876* (2013.01); *H01L 33/005* (2013.01); *H01L 33/36* (2013.01); *H01L 33/382* (2013.01); *H01L 2933/0016* (2013.01)

(58) Field of Classification Search
CPC ......... H01L 33/0079; H01L 2933/0016; H01L 33/382; H01L 33/62; H01L 33/36; H01L 33/48
(Continued)

(56) References Cited

U.S. PATENT DOCUMENTS 8,319,246 B2 * 11/2012 Sugizaki .................. H01L 24/02
257/737
2004/0009649 A1 * 1/2004 Kub ....................... B82Y 30/00
438/459

(Continued)

FOREIGN PATENT DOCUMENTS

DE  10 2007 030 129 A1    1/2009
EP   1 434 271 A2          6/2004
EP   2 393 133 A1         12/2011

OTHER PUBLICATIONS

Michael R. Oliver, "Chemical-mechanical planarization of semiconductor materials," Springer, Oct. 2003, vol. 69, Chapters 1 to 3, pp. 1-83.

(Continued)

*Primary Examiner* — Mark Tornow
*Assistant Examiner* — Priya Rampersaud
(74) *Attorney, Agent, or Firm* — DLA Piper LLP (US)

(57) ABSTRACT

A method of producing a plurality of optoelectronic semiconductor chips includes a) providing a layer composite assembly having a principal plane which delimits the layer composite assembly in a vertical direction, and includes a semiconductor layer sequence having an active region that generates and/or detects radiation, wherein a plurality of recesses extending from the principal plane in a direction of (Continued)

the active region are formed in the layer composite assembly; b) forming a planarization layer on the principal plane such that the recesses are at least partly filled with material of the planarization layer; c) at least regionally removing material of the planarization layer to level the planarization layer; and d) completing the semiconductor chips, wherein for each semiconductor chip at least one semiconductor body emerges from the semiconductor layer sequence.

10 Claims, 9 Drawing Sheets

(51) Int. Cl.
    *H01L 21/3205*     (2006.01)
    *H01L 21/283*     (2006.01)
    *H01L 31/18*     (2006.01)
    *H01L 33/36*     (2010.01)
    *H01L 33/00*     (2010.01)
    *H01L 33/38*     (2010.01)

(58) Field of Classification Search
    USPC .......................................................... 257/99
    See application file for complete search history.

(56) References Cited

U.S. PATENT DOCUMENTS

| | | | |
|---|---|---|---|
| 2009/0101886 A1* | 4/2009 | Chang | H01L 33/382 257/13 |
| 2010/0072489 A1* | 3/2010 | McLaurin | H01L 33/0079 257/88 |
| 2010/0078656 A1* | 4/2010 | Seo | H01L 27/156 257/88 |
| 2010/0140640 A1 | 6/2010 | Shimokawa et al. | |
| 2010/0264442 A1* | 10/2010 | Lee | H01L 33/40 257/98 |
| 2011/0027921 A1* | 2/2011 | Hamasaki | H01L 33/0095 438/26 |
| 2011/0233595 A1* | 9/2011 | Akimoto | H01L 27/1214 257/98 |
| 2011/0266544 A1* | 11/2011 | Park | H01L 27/3248 257/59 |
| 2011/0284906 A1 | 11/2011 | Lin et al. | |
| 2012/0007101 A1* | 1/2012 | Yang | H01L 33/382 257/76 |
| 2012/0292748 A1* | 11/2012 | Sadaka | H01L 21/31053 257/635 |

OTHER PUBLICATIONS

Patrick Leduc et al., "Enabling technologies for 3D chip stacking," IEEE, VLSI Technology, Systems and Applications, International Symposium on Apr. 21-23, 2008, pp. 76-78.

Pierric Gueguen et al., "Copper Direct-Bonding Characterization and Its Interests for 3D Integration," Journal of the Electrochemical Society, vol. 156, No. 10, 2009, pp. H772-H776.

Léa DiCioccio et al., "Vertical Metal Interconnect Thanks to Tungsten Direct Bonding," IEEE Electronic Components and Technology Conference, 2010, pp. 1359-1363.

English translation of the Notification of First Office Action dated Apr. 5, 2016, of corresponding Chinese Application No. 201280063569.1.

* cited by examiner

METHOD OF PRODUCING A PLURALITY OF OPTOELECTRONIC SEMICONDUCTOR CHIPS, AND OPTOELECTRONIC SEMICONDUCTOR CHIP

TECHNICAL FIELD

This disclosure relates to a method of producing a plurality of optoelectronic semiconductor chips, and to an optoelectronic semiconductor chip.

BACKGROUND

For optoelectronic semiconductor components such as luminescence diode chips, for example, a plurality of strata of structured layers arranged one above another are often required, for example, to make electrical contact with the components. The structuring of the layers can have the effect that subsequent layers have to be shaped over comparatively steep steps or edges. At such locations there is the risk of the latter not being sufficiently coated at every location during deposition of the layer which, by way of example, can lead to an electrical short circuit between two layers to be electrically insulated from one another.

It could therefore be helpful to provide a method of producing optoelectronic semiconductor chips which makes it possible to produce the semiconductor chips in a simple and reliable manner. Furthermore, it would be helpful to provide an optoelectronic semiconductor chip having a high reliability.

SUMMARY

We provide a method of producing a plurality of optoelectronic semiconductor chips including a) providing a layer composite assembly having a principal plane which delimits the layer composite assembly in a vertical direction, and including a semiconductor layer sequence having an active region that generates and/or detects radiation, wherein a plurality of recesses extending from the principal plane in a direction of the active region are formed in the layer composite assembly; b) forming a planarization layer on the principal plane such that the recesses are at least partly filled with material of the planarization layer; c) at least regionally removing material of the planarization layer to level the planarization layer; and d) completing the semiconductor chip, wherein for each semiconductor chip at least one semiconductor body emerges from the semiconductor layer sequence.

We also provide an optoelectronic semiconductor chip including a layer composite assembly having a principal plane and including a semiconductor body having an active region that generates and/or detects radiation, wherein at least one recess extending from the principal plane in a direction of the active region is formed in the layer composite assembly, and the semiconductor chip includes a planarization layer having a larger vertical extent in the region of the recess than in a region spaced apart laterally from the recess.

We further provide a method of producing a plurality of optoelectronic semiconductor chips including a) providing a layer composite assembly having a principal plane, which delimits the layer composite assembly in a vertical direction, and including a semiconductor layer sequence having an active region that generates and/or detects radiation, wherein a plurality of recesses extending from the principal plane in a direction of the active region are formed in the layer composite assembly; b) forming a planarization layer on the principal plane such that the recesses are at least partly filled with material of the planarization layer; c) at least regionally removing material of the planarization layer to level the planarization layer, wherein the semiconductor layer sequence is fixed to a carrier by a direct bonding connection, the layer composite assembly being planarized by the planarization layer such that a planar surface is provided for the direct bonding to the carrier; and d) completing the semiconductor chips, wherein for each semiconductor chip at least one semiconductor body emerges from the semiconductor layer sequence.

BRIEF DESCRIPTION OF THE DRAWINGS

FIGS. 2a to 2D show a second example of a method of producing a plurality of optoelectronic semiconductor chips on the basis of intermediate steps respectively illustrated in schematic sectional view.

DETAILED DESCRIPTION

Our methods of producing a plurality of optoelectronic semiconductor chips may involve providing a layer composite assembly having a principal plane, which delimits the layer composite assembly in a vertical direction. The layer composite assembly furthermore comprises a semiconductor layer sequence having an active region that generates and/or detects radiation. A plurality of recesses extending from the principal plane in the direction of the active region are formed in the layer composite assembly. A planarization layer is formed on the principal plane such that the recesses are at least partly filled with material of the planarization layer. Material of the planarization layer is removed at least regionally to level the planarization layer. The semiconductor chips are completed, wherein for each semiconductor chip a semiconductor body emerges from the semiconductor layer sequence. Completion comprises, for example, singulating the layer composite assembly into semiconductor chips.

A vertical direction is understood to mean a direction running perpendicular to a principal extension plane of the semiconductor layers of the semiconductor layer sequence.

The principal plane is understood to mean, in particular, that plane which delimits the layer composite assembly in a vertical direction directly before deposition of the material of the planarization layer. That is to say that the layer composite assembly does not project beyond the principal plane at any location. In other words, the layer composite assembly, proceeding from the principal plane, has depressions in the form of the recesses, but no elevations which extend beyond the principal plane in a vertical direction.

The principal plane furthermore constitutes a mathematical plane. That is to say that the principal plane can be defined, for example, by a reference point and two vectors spanning the plane. Preferably, the principal plane runs parallel to the principal extension plane of the semiconductor layers of the semiconductor layer sequence.

The semiconductor layer sequence preferably extends in a vertical direction between a first main area and a second main area. The second main area is formed on that side of the active region facing away from the principal plane.

The semiconductor layer sequence preferably comprises a first semiconductor layer and a second semiconductor layer, wherein the active region is arranged between the first semiconductor layer and the second semiconductor layer. The first semiconductor layer and the second semiconductor layer expediently have a mutually different conduction type. Furthermore, the first semiconductor layer and the second semiconductor layer can also be multilayered. The first semiconductor layer can form the first main area, and the second semiconductor layer can form the second main area.

The principal plane can be formed by the first main area of the semiconductor layer sequence or by a layer arranged on the first main area.

The recesses may extend into the semiconductor layer sequence. In particular, the recesses can extend through the active region. By way of example, the recesses can extend through the first semiconductor layer and through the active region into the second semiconductor layer. In the region of the recesses, electrical contact can be made with the second semiconductor layer in this case.

Alternatively, the recesses do not extend into the semiconductor layer sequence. In this case, the planarization layer can be provided, for example, to level recesses in an electrical connection layer applied on the first main area of the semiconductor layer sequence or in an electrical insulation layer.

Preferably, the recesses are completely filled after the planarization layer has been formed. After leveling, the planarization layer, on that side of the active region facing away from the second main area, forms a planarization area, which is particularly preferably planar. In this context, planar is understood to mean, in particular, that the planarization layer, apart from a surface roughness, is free of depressions extending in the direction of the active region. In a departure from this, it is also possible for the planarization area to have depressions in the region of the recesses. In this case, the depth of the depressions, that is to say the vertical extent of the depressions, is, however, preferably at most half the magnitude of the depth of the recesses before the planarization layer is formed. In this case, therefore, the planarization layer reduces the depth of the recesses without completely leveling the latter.

The planarization area can serve as a starting point for further production steps, for example, for deposition of electrically conductive and/or electrically conducting layers or for a further micro structuring.

Preferably, the planarization layer is mechanically and/or chemically polished for leveling purposes. A chemical mechanical polishing (CMP) method is particularly preferably employed. With such a method, planar planarization areas can be produced in a simple and reliable manner.

Preferably, the semiconductor layer sequence is fixed to a carrier by a cohesive connection.

The connection to the carrier can be electrically conductive or electrically insulating. The connection is effected preferably after leveling the planarization layer and with further preference before singulation into semiconductor chips.

In the case of a cohesive connection, the preferably prefabricated connection partners are held together by atomic and/or molecular forces. A cohesive connection can be obtained, for example, by a connection layer, for instance, an adhesive layer or a solder layer. In general, separation of the connection is accompanied by destruction of the connection layer and/or of at least one of the connection partners.

With the planarization layer, the layer composite assembly can be leveled such that a planar area is available for cohesive connection to the carrier. In the case of a cohesive connection by a connection layer, therefore, the connection layer can have a uniform thickness in a lateral direction. In other words, the connection layer does not have to compensate for any depressions of the layer composite assembly.

The semiconductor layer sequence may be fixed to the carrier by a direct bonding connection. In the case of a direct bonding connection, the mechanical connection can be obtained by hydrogen bridges and/or van der Waals interactions. For a direct bonding connection as cohesive connection, the areas to be connected have to be particularly planar. This can be obtained in a simplified manner by the planarization layer. A direct bonding connection is preferably effected by at least one dielectric layer, particularly preferably between two dielectric layers. The dielectric layer preferably contains an oxide, for example, silicon oxide. Particularly preferably, the direct bonding connection is effected between two silicon oxide layers. The production of the direct bonding connection is preferably obtained only by pressure.

During leveling, the planarization layer may be thinned only to an extent such that the planarization layer completely covers the principal plane after thinning. The planarization layer therefore forms a continuous planarization area on the side facing away from the active region.

Alternatively, the principal plane is regionally uncovered during leveling. Before the planarization layer is formed, a stop layer may be formed on the semiconductor layer sequence, the stop layer forming the principal plane. The stop layer is regionally uncovered during leveling. The stop layer is expediently such that, during the leveling of the planarization layer, the stop layer is removed at a lower removal rate than the material of the planarization layer. The stop layer can be used to predetermine in a simplified manner at what location in a vertical direction the leveling step stops.

For complete coverage of the principal plane, further material of the planarization layer can be deposited after the principal plane has been uncovered. By such two-stage application of material of the planarization layer, the thickness of the planarization layer can be set during deposition of the further material, for example, by way of the duration of the deposition at a predetermined deposition rate.

Preferably, after leveling, an opening is formed in the planarization layer in the region of the recesses. The opening can extend in a vertical direction completely through the planarization layer. The opening can be provided to produce an electrically conductive connection to the semiconductor layer sequence. By way of example, in the region of the opening an electrically conductive connection to the second semiconductor layer can be produced if the opening extends through the active region.

Afterward, the opening can be filled at least regionally, in particular by a further planarization layer.

In this case, the planarization area of the planarization layer or a layer arranged thereon can form a further principal plane, wherein the openings can be completely filled by the further planarization layer. The further planarization layer can be formed and leveled as described in connection with the planarization layer.

Preferably, the planarization layer is electrically insulating and the further planarization layer is electrically conductive. In particular, the further planarization layer can be provided to make electrical contact with the semiconductor layer sequence, in particular the second semiconductor layer, while the planarization layer electrically insulates the further planarization layer from the semiconductor layer sequence and/or an electrically conductive layer applied on the semiconductor layer sequence. The risk of insufficient coverage of the sidewalls of the recesses is avoided or at least reduced by a planarization layer.

Further preferably, the first semiconductor layer is electrically contact-connected by a first connection region and the second semiconductor layer is electrically contact-connected by a second connection region, in each case from the first main area, wherein the recesses extend from the first main area through the active region into the second semiconductor layer. The second connection region or an electrical insulation layer between the second connection region and the first semiconductor layer is formed by the planarization layer.

The planarization layer therefore serves to level the recesses provided to make electrical contact with the second semiconductor layer.

An optoelectronic semiconductor chip may comprise a layer composite assembly having a principal plane, which delimits the layer composite assembly preferably in a vertical direction. Furthermore, the layer composite assembly comprises a semiconductor body having an active region that generates and/or detects radiation, wherein at least one recess extending from the principal plane in the direction of the active region is formed in the layer composite assembly. The semiconductor chip comprises a planarization layer having a larger vertical extent in the region of the recess than in a region spaced apart laterally from the recess. In the extreme case, the planarization layer can be present only in the region of the recess. In this case, the vertical extent of the planarization layer in a lateral direction alongside the recess is 0. In the case of a vertical extent different than 0, the planarization layer expediently directly adjoins the principal plane. Furthermore, the planarization layer can be formed on the layer composite assembly, in particular on the semiconductor body.

With the planarization layer, shaping over edges occurring in the region of the recesses can be effected in a simplified manner in comparison with a conventional shaping-over process by deposition without subsequent leveling. In particular, the thickness of the planarization layer relative to a direction running perpendicular to a side area of the recess can also be greater than the vertical extent of the planarization layer in the region arranged laterally alongside the recess. The risk of ingress of moisture or negative effects caused by electromigration on account of insufficient shaping over edges can thus be avoided. Such an optoelectronic semiconductor chip can therefore have an improved ageing behavior and is thus distinguished by increased reliability.

The method described further above is particularly suitable for producing such an optoelectronic semiconductor chip. Features described in connection with the method can therefore also be used for the optoelectronic semiconductor chip, and vice versa.

Further features, configurations and expediencies will become apparent from the following description of examples in conjunction with the figures.

Elements which are identical, of identical type or act identically are provided with the same reference signs in the figures.

The figures and the size relationships of the elements illustrated in the figures among one another should not be regarded as to scale. Rather, individual elements may be illustrated with an exaggerated size to enable better illustration and/or to afford a better understanding.

A first example of a method of producing a plurality of optoelectronic semiconductor chips is described schematically with reference to FIGS. 1A to 1F, wherein, for simplified illustration, each of the figures shows only an excerpt representing, in a completed semiconductor chip, a partial region of the semiconductor chip. The example is described here on the basis of production of a thin-film semiconductor chip, for example a thin-film light emitting diode chip. In the case of a thin-film semiconductor chip, a growth substrate for the epitaxial deposition of a semiconductor layer sequence is removed.

Figure 1A:
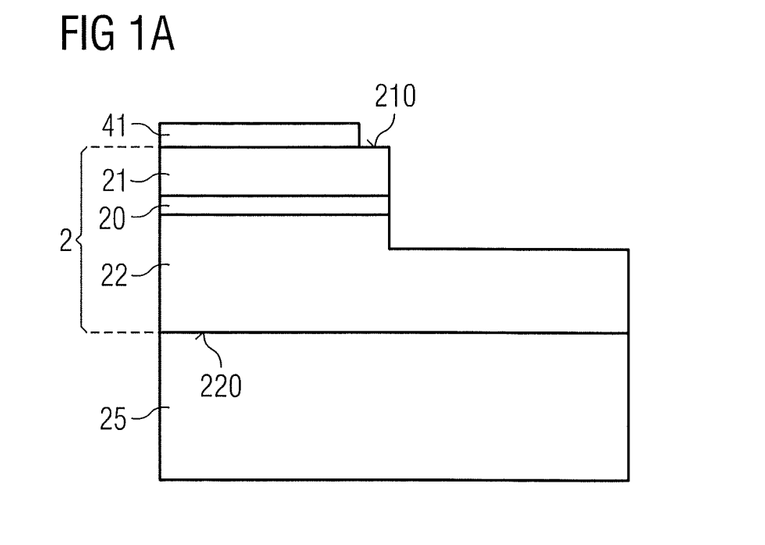
FIGS. 1A to 1F show a first example of a method of producing a plurality of optoelectronic semiconductor chips on the basis of intermediate steps respectively illustrated in schematic sectional view.

As illustrated in FIG. 1A, a semiconductor layer sequence 2 is provided, which extends in a vertical direction, that is to say a direction running perpendicular to a principal extension plane of the semiconductor layers of the semiconductor layer sequence 2, between a first main area 210 and a second main area 220. The semiconductor layer sequence has an active region 20 that generates radiation and/or receives radiation, the active region being arranged between a first semiconductor layer 21 of a first conduction type and a second semiconductor layer 22 of a second conduction type, which is different from the first conduction type. By way of example, the first semiconductor layer can be p-conducting and the second semiconductor layer can be n-conducting, or vice versa.

The active region 20, the first semiconductor layer 21 and the second semiconductor layer 22 can in each case be single-layered or multilayered. In particular, the active region can have a quantum structure, for example a multiple quantum structure (multiple quantum well structure, MQW structure).

The semiconductor layer sequence 2 is provided on a growth substrate 25 for the epitaxial deposition of the semiconductor layer sequence 2. The semiconductor layer sequence, in particular the active region 20, preferably contains a III-V compound semiconductor material.

III-V compound semiconductor materials are particularly suitable for generating radiation in the ultraviolet (nitridic compound semiconductor material, for instance $Al_x In_y Ga_{1-x-y} N$) through the visible (nitride compound semiconductor material, for instance $Al_x In_y Ga_{1-x-y} N$, in particular for blue to green radiation, or phosphide compound semiconductor material, for instance $Al_x In_y Ga_{1-x-y} P$, in particular for yellow to red radiation) to the infrared (arsenide compound semiconductor material, for instance $Al_x In_y Ga_{1-x-y} As$) spectral range. It respectively holds true here that $0 \leq x \leq 1$, $0 \leq y \leq 1$ and $x+y \leq 1$, in particular where $x \neq 1$, $y \neq 1$, $x \neq 0$ and/or $y \neq 0$. With III-V semiconductor materials, in particular from the material systems mentioned, high internal quantum efficiencies can furthermore be obtained when generating radiation.

As growth substrate, for example, sapphire, silicon or silicon carbide is suitable for nitride compound semiconductor material. Gallium arsenide, for example, can be employed for arsenidic or phosphidic compound semiconductor material.

A first connection region 41 is formed on the first main area 210, the first connection region making electrical contact with the first semiconductor layer 21.

Figure 1B:
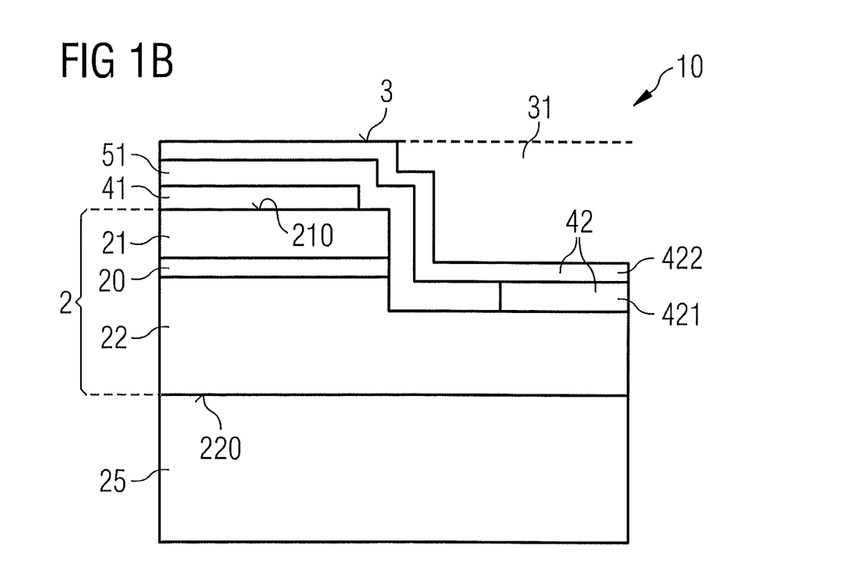

As illustrated in FIG. 1B, an insulation layer 51 is applied on the first main area 210. Furthermore, a first layer 421 of a second connection region 42 is deposited in a region in which the second semiconductor layer 22 is uncovered. The first layer is provided for an electrically conductive connection to the second semiconductor layer 22 and with respect to the material is selected with regard to a low contact resistance.

Suitable material for the connection regions 41, 42 or layers thereof includes, in particular, a metal, for example, silver, aluminum, palladium, rhodium, nickel or gold, or a metallic alloy comprising at least one of the materials mentioned, or a TCO (transparent conductive oxide) material, for example, indium tin oxide (ITO) or zinc oxide. The layers can be applied on the prefabricated semiconductor layer sequence, for example, by vapor deposition or sputtering.

A second layer 422 of the second connection region 42 is deposited on the first layer 421. The second layer preferably has a high reflectivity for the radiation to be received or generated in the active region 20. In particular, silver or a silver-containing alloy is distinguished by a high reflectivity in the visible and ultraviolet spectral range, and in particular gold is distinguished by a high reflectivity in the infrared. However, it is also possible to employ some other metal from among those mentioned above in association with the connection regions.

The semiconductor layer sequence 2 and the layers arranged on the semiconductor layer sequence form a layer composite assembly 10. In a vertical direction, the layer composite assembly is delimited by a principal plane 3.

The second layer 422 of the second connection region 42 forms the principal plane 3. A recess 31 extends from the principal plane in the direction of the active region 20. The recess 31 also extends into the semiconductor layer sequence 2. In a departure from this, however, the semiconductor layer sequence can also be planar such that the recess only extends through the layers arranged on the semiconductor layer sequence.

Figure 1C:
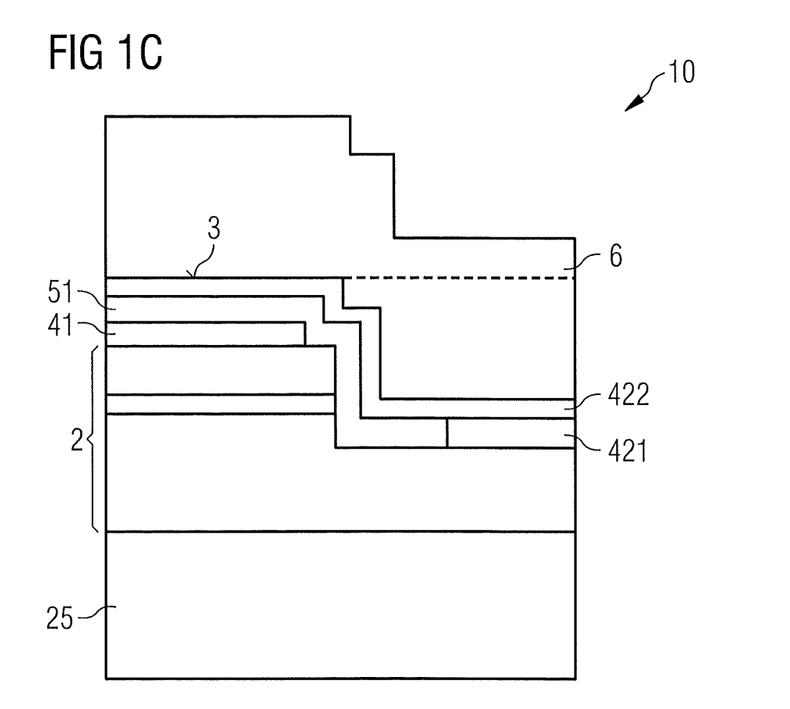

A planarization layer 6 is applied directly to the principal plane 3 (FIG. 1C). The planarization layer has a thickness such that it projects beyond or at least reaches the principal plane 3 at every location of the layer composite assembly 10.

Figure 1D:
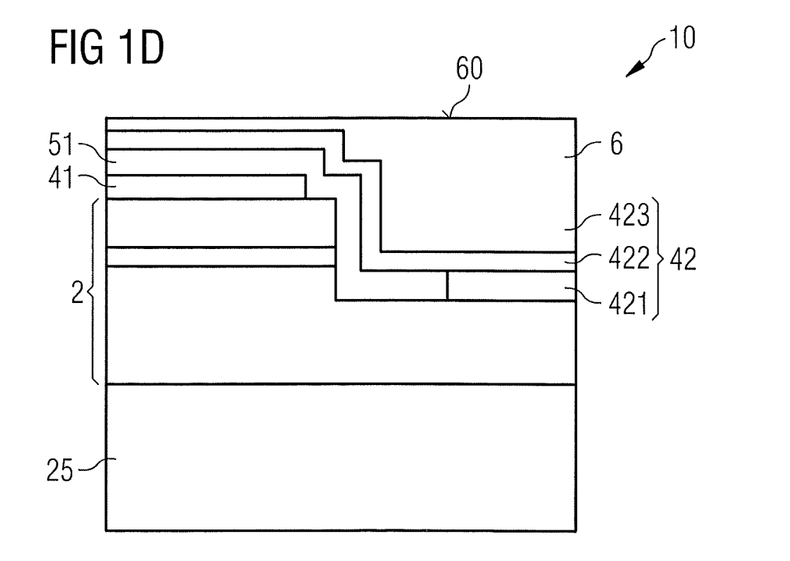

Afterward, as illustrated in FIG. 1D, material of the planarization layer 6 is regionally removed to thus level the layer composite assembly 10. A side of the planarization layer 6 facing away from the active region 20 forms a planarization area 60, which runs in planar fashion. That is to say that the planarization area, apart from surface roughnesses, has no more depresssions, in particular no more depressions caused by a microstructuring of an underlying layer.

Removal of the material is preferably effected by a chemical mechanical polishing method. Particularly planar surfaces can be produced with this method. However, it is also possible to employ a purely chemical or a purely mechanical method.

During leveling, the planarization layer 6 is thinned only to an extent such that the planarization area 60 of the planarization layer 6 constitutes a continuous vertical boundary of the layer composite assembly 10.

The planarization layer 6 forms a third layer 423 of the second connection region 42. In this case, the planarization layer is expediently electrically conductive. By way of example, the planarization layer can contain tungsten, aluminum or copper or consist of such a material.

Figure 1E:
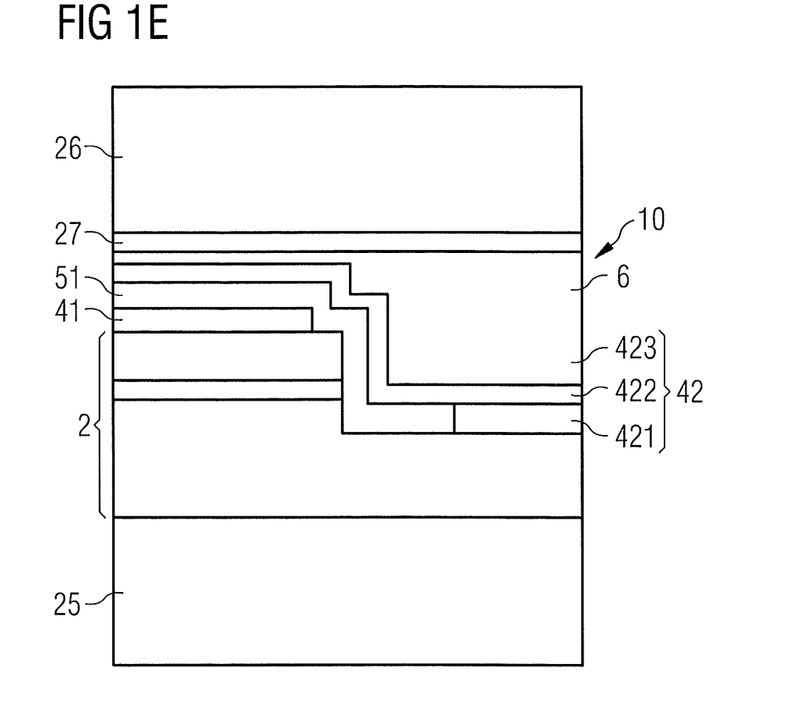

Afterward, the layer composite assembly 10 (as illustrated in FIG. 1E) can be connected to a carrier 26. The cohesive connection to the carrier can be effected, for example, by a connection layer 27, for instance a solder layer or an electrically conductive or electrically insulating adhesive layer. The connection layer can contain, for example, Au, Sn, Ni or In or a metallic alloy comprising at least one of the metals mentioned or can consist of such a material.

With the planarization layer 6, the layer composite assembly 10 has a planar surface for the connection to the carrier 26. The connection layer 27 can therefore have a uniform thickness and does not have to compensate for unevennesses in the topography of the layer composite assembly. The risk of cavities in the connection layer is thus reduced. Furthermore, the need for noble metal is reduced compared with a method in which recesses are filled with liquid solder, for example, a gold-containing solder such as AuSn. The connection between the carrier and the layer composite assembly 10 can therefore be effected in a manner free of noble metal or with a reduced noble metal requirement. Furthermore, the planarization layer 6 can simultaneously fulfill the function of a solder barrier.

In particular, with the planarization layer 6 on the part of the layer composite assembly 10 such a planar surface may be provided for the connection to the carrier 26 that the cohesive connection can also be produced by direct bonding. For this purpose, partial layers of the connection layer 27 in the form of a dielectric layer, for example, a silicon oxide layer, can in each case be applied, for example, on the layer composite assembly 10 and the carrier 26. Depending on the material of the carrier 26 and the material of the planarization layer 6, a direct bonding connection can also be effected without a connection layer or with only one connection layer.

By way of example, a semiconductor material, for instance silicon or germanium, a ceramic, for example, silicon nitride, aluminum nitride or boron nitride, or a metal, for example, molybdenum, tungsten, copper, or a metallic alloy, for example comprising one of the materials mentioned, is suitable for the carrier 26.

Figure 1F:
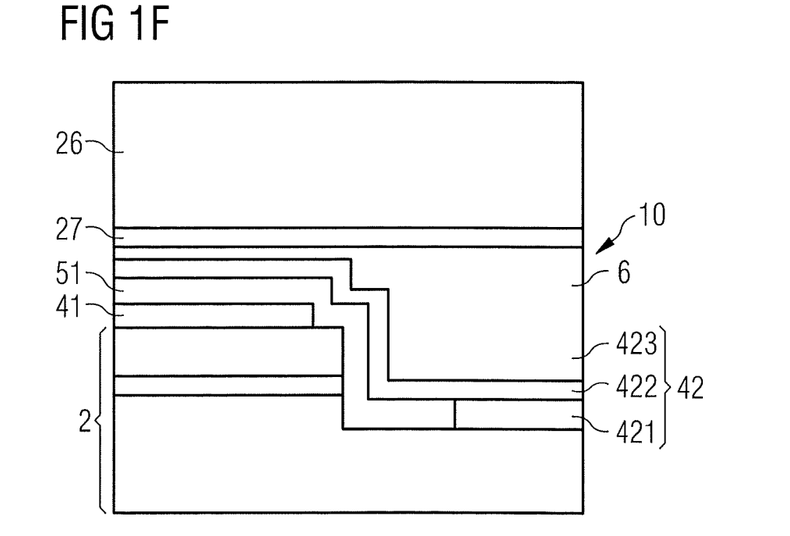

The carrier 26 serves, in particular, for mechanical stabilization of the semiconductor layer sequence 2. The growth substrate 25 is no longer necessary for this purpose and can be removed, as illustrated in FIG. 1F. Removal of the growth substrate can be effected, for example, by a laser lift-off method, mechanically, for instance by grinding, lapping or polishing, and/or chemically, for instance by etching.

The described method for leveling the topography of the layer composite assembly 10 can be employed, in principle, in production of optoelectronic semiconductor chips, for example, luminescence diodes, laser diodes or radiation detectors. The method is also suitable for leveling a layer composite assembly in which the semiconductor layer sequence is not provided on a growth substrate, but rather on a carrier different than the growth substrate.

Furthermore, the planarization layer need not necessarily make electrical contact with semiconductor layer sequences. In this case, the planarization layer can also be electrically insulating. By way of example, an oxide, for instance silicon oxide, a nitride, for instance silicon nitride, or an oxynitride, for instance silicon oxynitride, is suitable for an electrically insulating planarization layer. $Al_2O_3$, $Y_xAl_yO_3$, $TiO_2$ or $HfO_2$ can also be employed.

To complete the semiconductor chips, the carrier 26 with the layer composite assembly 10 arranged thereon can be singulated, for example, mechanically, for instance by sawing, breaking, splitting, chemically, for instance by etching, or by a laser separation method (not explicitly illustrated). As a result of the singulation, for each semiconductor chip a semiconductor body emerges from the layer composite assembly, the semiconductor body respectively being arranged on a part of the carrier 26.

Figure 2A:
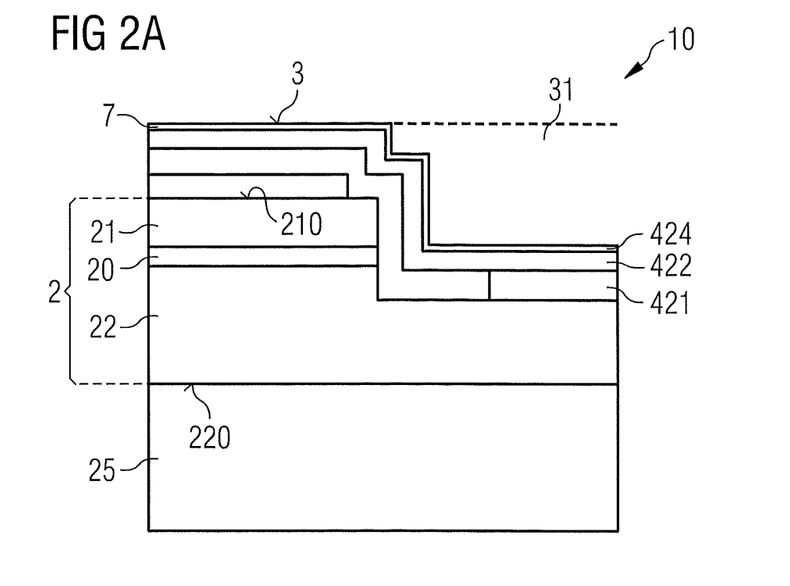
Figure 2B:
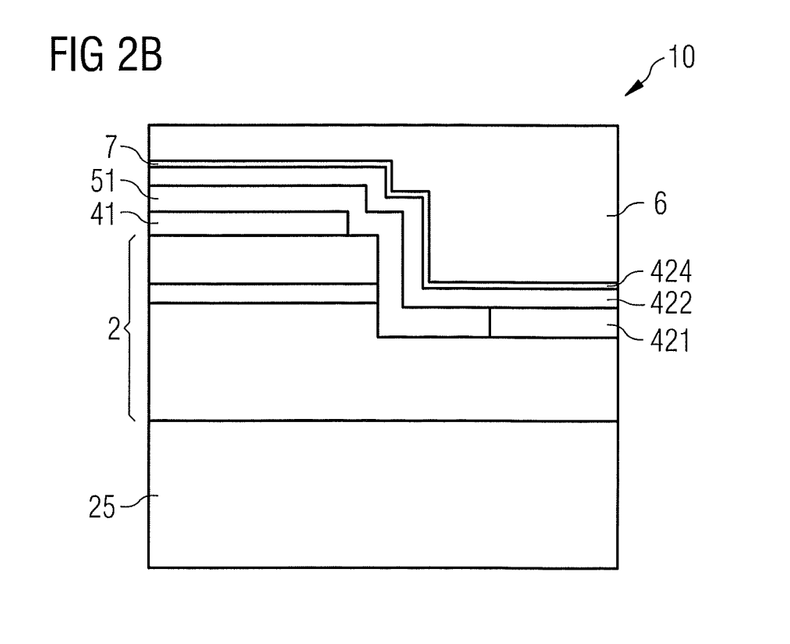

A second example of a production method is illustrated schematically in sectional view in FIGS. 2A to 2D. This second example substantially corresponds to the first example described in connection with FIGS. 1A to 1F. In contrast thereto, a stop layer 7 applied to the semiconductor layer sequence 2 forms the principal plane 3. Afterward, as illustrated in FIG. 2B, a planarization layer 6 is applied such that the recess 31 is completely filled with material of the planarization layer and the planarization layer 6 projects beyond the principal plane 3 in a vertical direction at every location of the layer composite assembly.

Figure 2C:
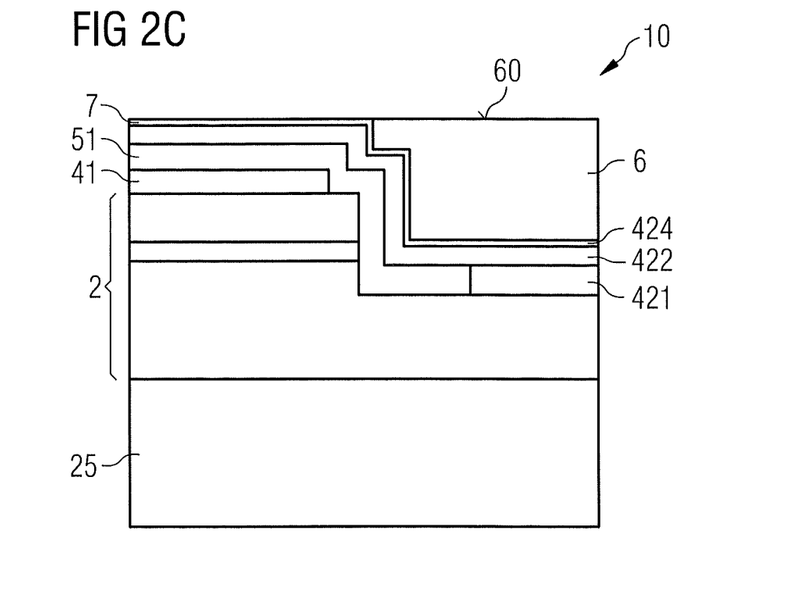

Removal of the material of the planarization layer 6 is effected such that the method stops when the stop layer 7 is reached. In this case, the planarization area 60 is formed regionally by the stop layer 7 and regionally by the planarization layer 6 (FIG. 2C).

The stop layer 7 forms a fourth layer 424 of the second connection region 42.

Figure 2D:
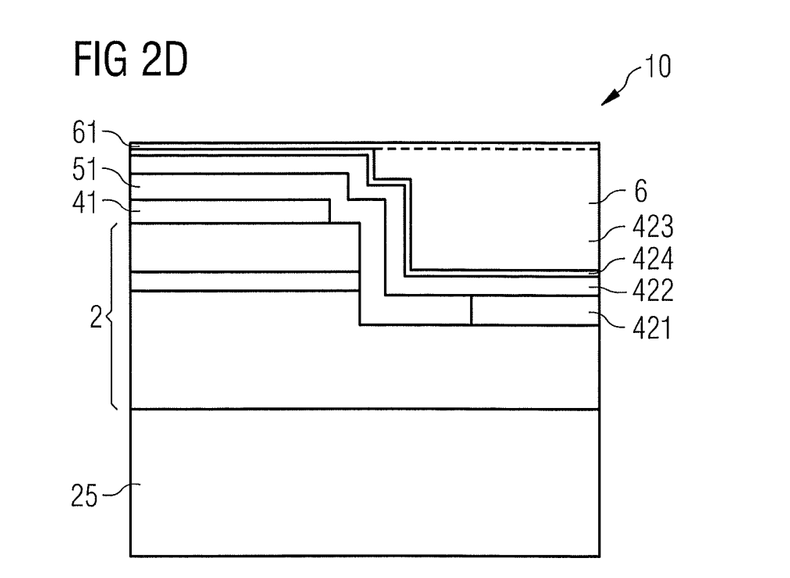

Optionally, as illustrated in FIG. 2D, further material 61 of the planarization layer 6 can be applied such that the semiconductor layer sequence 2 is completely covered with material of the planarization layer 6.

Expediently, the stop layer 7 is formed by a material which during leveling has a lower removal rate than the material of the planarization layer 6. The stop layer 7 is expediently electrically conductive. If the stop layer in the completed element does not serve for electrical contact-connection, an electrically insulating material can also be employed. By way of example, in a departure from the example shown, an electrically insulating stop layer 7 can also be applied to the semiconductor layer sequence 2 only regionally such that the stop layer does not cover or only partly covers the semiconductor layer sequence 2 in the region of the recesses 31. Electrical contact can be made with the second semiconductor layer in a region not covered by the electrically insulating stop layer. Furthermore, depending on the construction of the semiconductor chip, the stop layer 7 can be radiation-transmissive to the radiation generated or received during operation, for instance with a transmission of at least 60%, or as reflective, for instance with a reflectivity of at least 60%.

The subsequent steps for completing the semiconductor chips can take place as described in connection with FIGS. 1D and 1F.

Figure 3A:
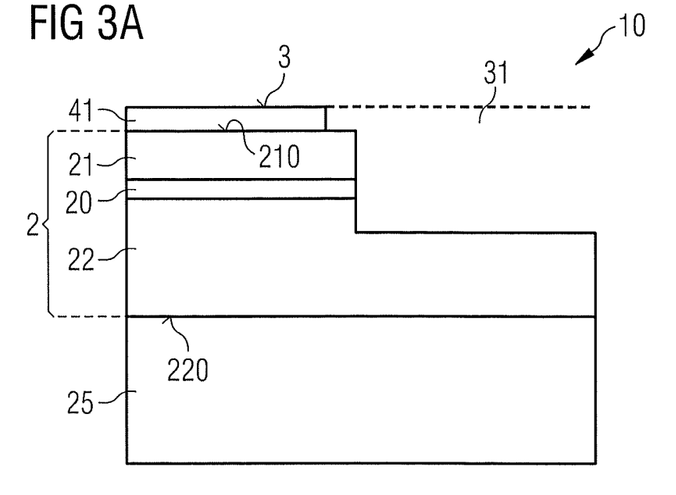
FIGS. 3A to 3F show a third example of a method of producing a plurality of optoelectronic semiconductors chips on the basis of intermediate steps respectively illustrated in schematic sectional view.
Figure 3B:
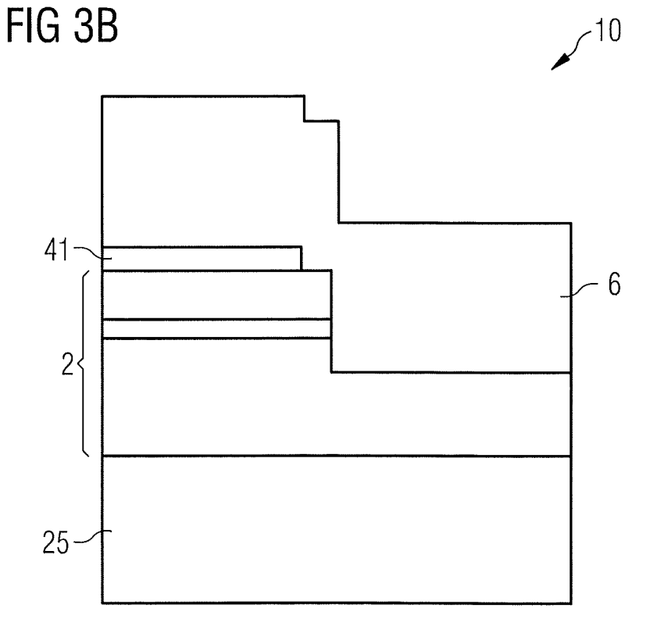

A third example of a method of producing a plurality of optoelectronic semiconductor chips is illustrated schematically in FIGS. 3A to 3F. This example substantially corresponds to the first example described in connection with FIGS. 1A to 1F. In contrast thereto, the planarization layer 6 does not form an electrical connection region for the semiconductor layer sequence 2. As illustrated in FIG. 3A, the first connection region 41 forms the principal plane 3 of the layer composite assembly 10. The planarization layer 6 is applied such that the recess 31 is completely filled with material of the planarization layer (FIG. 3B).

Figure 3C:
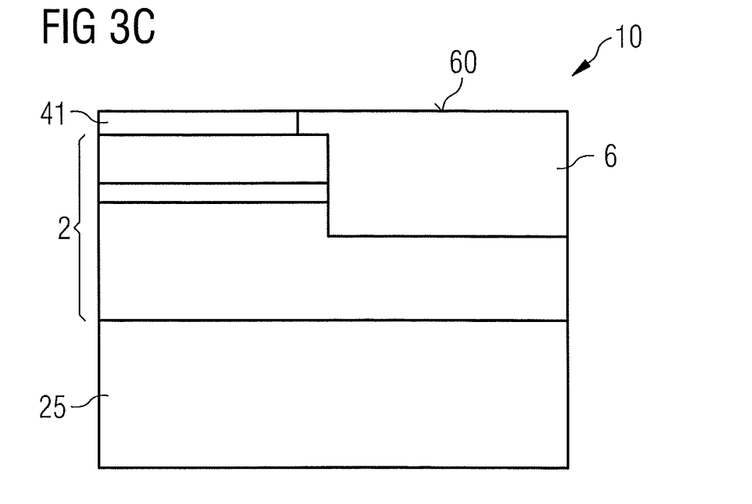

Leveling the planarization layer can be carried out as described in connection with the previous examples, wherein the leveling in this example is effected such that the planarization layer 6 terminates flush with the first connection region 41 after leveling. The first connection region 41 and the planarization layer 6 therefore form the planarization area 60 (FIG. 3C).

Figure 3D:
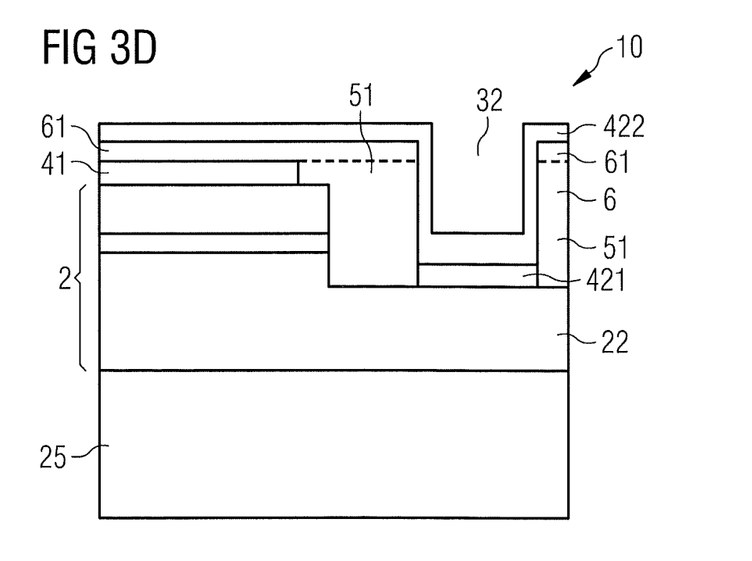

Afterward, as illustrated in FIG. 3D, further material 61 of the planarization layer can be applied such that the first connection region 41 is completely covered with material of the planarization layer. The planarization layer 6 thus produced by a two-stage deposition and leveling carried out between the two deposition steps forms an insulation layer 51. With the method described, it is possible to set the layer thickness of the insulation layer 51 in the region above the first connection region 41 by way of the deposition duration for the further material 61 of the planarization layer. The layer thickness is therefore independent of the implementation of the leveling of the planarization layer. The leveling can also already be stopped before the first connection region 41 is reached (cf. FIG. 1D). In this case, formation of the further material 61 of the planarization layer is not necessary.

To make electrical contact with the second semiconductor layer 22, an opening 32 is formed in the region of the recess 31, the opening extending completely through the planarization layer 6. Afterward, a first layer 421 and a second layer 422 are applied to form the second connection region 42.

Figure 3E:
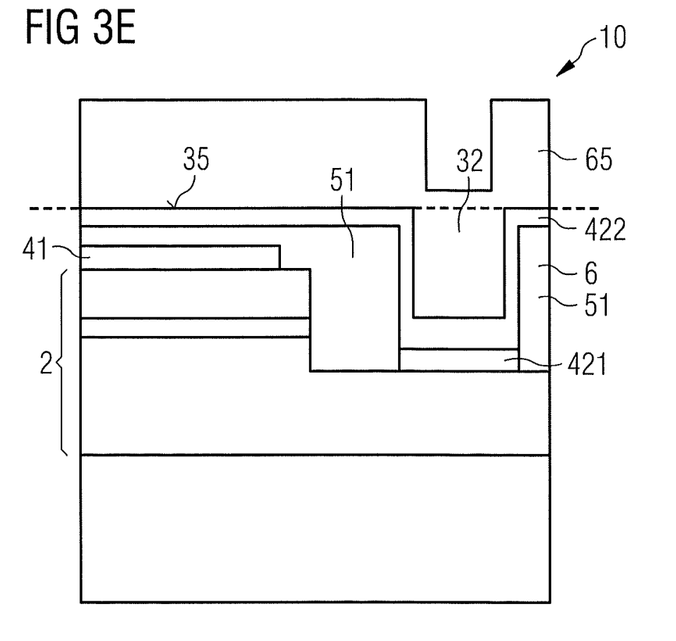
Figure 3F:
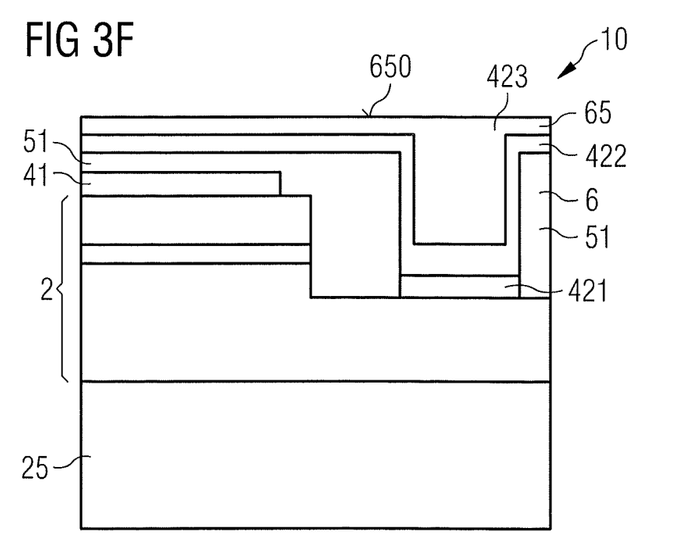

The second layer 422 forms a further principal plane 35 for a further planarization step. A further planarization layer 65 is applied to the further principal plane such that the opening 32 is completely filled (FIG. 3E). Afterward, the further planarization layer 65 is leveled such that the further planarization layer 65 forms a continuous further planarization area 650 (FIG. 3F).

Therefore, two planarization steps are carried out, wherein an electrical insulation layer is formed by the first planarization layer and a partial layer of the second connection region 42 is formed by the further planarization layer 65. Two electrically insulating planarization layers or two electrically conductive planarization layers may also be expedient, depending on the construction of the semiconductor chip to be produced.

Suitable material for an electrically conductive planarization layer includes, for example, a metal, for instance Ag, Au, Cu, Cr, Ni, Mo, W, Ti, V, Pd, Pt or Sn, a metallic alloy comprising at least one of the metals mentioned, or a transparent conductive oxide, for example, ZnO, ITO (indium tin oxide) or IZO (indium zinc oxide).

Completion of the semiconductor chips can once again be effected as described in connection with FIGS. 1E to 1F.

Figure 4:
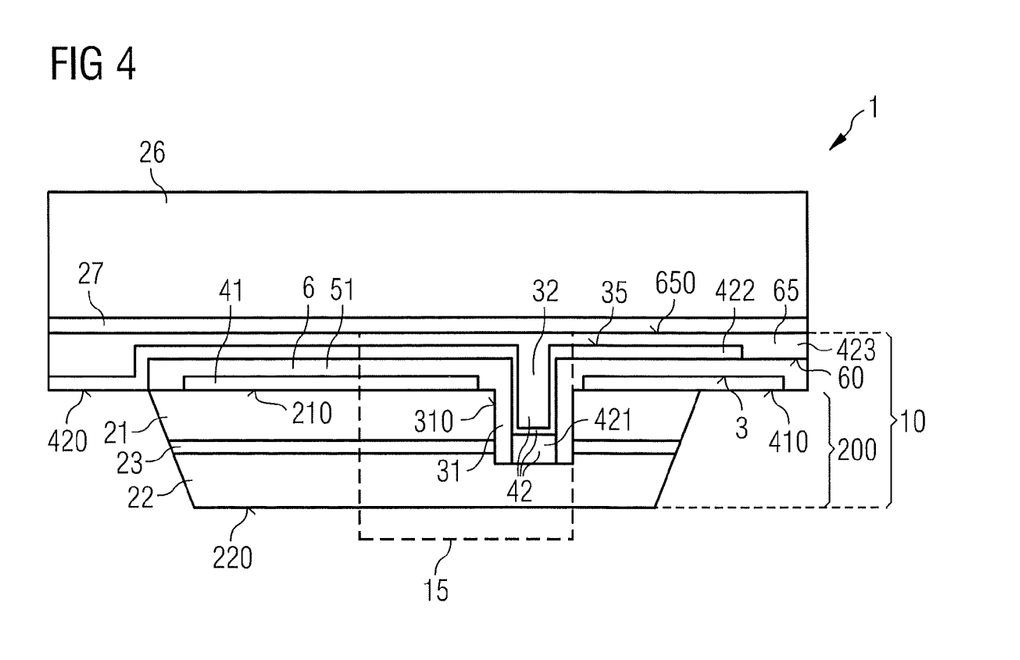
FIG. 4 shows an example of a semiconductor chip in schematic section view.

An example of an optoelectronic semiconductor chip 1 is illustrated schematically in sectional view in FIG. 4. Such a semiconductor chip can be produced as described in connection with FIGS. 3A to 3F. In this case, an excerpt 15 substantially corresponds to the excerpt from the layer composite assembly 10 as illustrated in FIG. 3F.

The semiconductor chip 1 comprises a semiconductor body 200, which emerges from the semiconductor layer sequence 2 during production and has an active region 20 arranged between a first semiconductor layer 21 and a second semiconductor layer 22. The semiconductor body 2 connects to the carrier 26 by a connection layer 27. The semiconductor chip 1 comprises a first contact area 410, formed by a first connection region 41, and a second external contact area 420, which is formed by a second connection region 42.

Merely for the sake of simplified illustration, the semiconductor body 2 has only one recess 31 extending from a first main area 210 through the first semiconductor layer 21 and the active region 20 into the second semiconductor layer 22. For charge carrier injection that is uniform in a lateral direction via the second semiconductor layer into the active region 20, a plurality of such recesses can also be expedient, in particular depending on the transverse conductivity of the second semiconductor layer 22.

By applying an external voltage between the external contact areas 410, 420, charge carriers can be injected from opposite sides into the active region and recombined there with emission of radiation. In the case of a semiconductor chip 1 disclosed as a radiation receiver, an electrical signal can be tapped off at the external contact areas 410, 420.

Electrical contact can be made with the semiconductor chip 1 from that side of the carrier 26 facing the semiconductor body 200. Therefore, electrical contact is made with the semiconductor chip independently of the connection layer 27 and the carrier 26, such that electrically insulating materials can also be employed for them. In a departure from this, it is also possible to arrange one contact area or two contact areas on that side of the carrier 26 facing away from the semiconductor body 2. By way of example, the second external contact area 420 can be arranged on that side of the carrier 26 facing away from the semiconductor body 2 such that electrical contact is made with the second semiconductor layer 22 via the second connection region 42, the connection layer 27 and through the carrier 26. In this case, the carrier 26 is preferably electrically conductive. In a departure therefrom however, it is also possible to employ an electrically insulating carrier, in the case of which electrical contact is made through the carrier by via holes in the carrier.

A surface of the first connection region 41 facing away from the semiconductor body 200 forms a principal plane 3, from which the recess 31 extends into the semiconductor body. A planarization layer 6 forms an insulation layer 51. The planarization layer has a larger vertical extent in the region of the recess 31 than in a region spaced apart from the recess in a lateral direction, that is to say in a direction running along a principal extension plane of the semiconductor layers of the semiconductor layer sequence. Furthermore, the thickness of the planarization layer in a direction running perpendicular to a side area 310 can be greater than the vertical extent of the planarization layer in a region spaced apart laterally from the recess. A reliable coverage of the side area 310 of the recess with insulating material can thus be obtained in a simplified manner.

A surface of a third layer 423 of the second connection region 42 facing away from the semiconductor body 200 forms a further principal plane 35. A further planarization layer 65 adjoins the further principal plane 35, and forms a third layer of the second connection region 42. The further planarization layer forms a planar further planarization area 65 on the side facing away from the semiconductor body. The connection layer 27 can thus have a constant thickness over the entire lateral extent of the semiconductor chip.

The semiconductor chip 1 can also comprise a plurality of semiconductor bodies 2 electrically conductively connected to one another via the connection regions 41, 42. By way of example, by the connection regions 41, 42, the first semiconductor layer 21 of a first semiconductor body can be electrically conductively connected to the second semiconductor layer 22 of a second semiconductor body such that the semiconductor bodies can be electrically interconnected in series with one another. With a multiplicity of optoelectronic semiconductor chips connected in series, the semiconductor chip 1 can be operated with increased operating voltages, for example, with a power supply system voltage of 110 V or 220 V.

The recess can also be as described in connection with FIGS. 1A to 1F and 2A to 2D.

The method is very generally suitable for improved shaping over steps or edges of a component topography. With the method described, in particular both electrically insulating layers and electrically conductive layers can be particularly simple and reliable such that edges to be shaped over are reliably coated with a sufficient thickness. Thus, by way of example, an electrical short circuit between two layers which are to be electrically isolated from one another can be avoided. During production of thin-film chips wherein the semiconductor body is fixed to a carrier different than a growth substrate, the production of a cohesive connection is furthermore simplified.

Our methods and chips are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A method of producing a plurality of optoelectronic semiconductor chips comprising:
    a) providing a layer composite assembly having a principal plane which delimits the layer composite assembly in a vertical direction, and comprising a semiconductor layer sequence having an active region that generates and/or detects radiation, wherein a plurality of recesses extending from the principal plane in a direction of the active region are formed in the layer composite assembly;
    b) forming a planarization layer on the principal plane such that the recesses are completely filled with material of the planarization layer;
    c) at least regionally removing material of the planarization layer to level the planarization layer and regionally uncover the principal plane such that the planarization layer completely fills the recesses and that a surface of the planarization layer is planar directly after c), and the surface of the planarization layer and the regionally uncovered principal plane together form a planarization area directly after removal of material of the planarization layer, wherein the planarization area is planar over the entire layer composite assembly;
    d) depositing a further planarization material on the principal plane such that the semiconductor layer sequence is completely covered with material of the planarization layer; and
    e) completing the semiconductor chips, wherein for each semiconductor chip at least one semiconductor body emerges from the semiconductor layer sequence.

2. The method according to claim 1, wherein the planarization layer is mechanically and/or chemically polished in c).

3. The method according to claim 1, wherein the recesses extend through the active region.

4. The method according to claim 1, wherein the semiconductor layer sequence is fixed to a carrier by a cohesive connection.

5. The method according to claim 4, wherein the semiconductor layer sequence is fixed to the carrier by a direct bonding connection.

6. The method according to claim 1, wherein, before b), a stop layer is formed on the semiconductor layer sequence, said stop layer forming the principal plane, and wherein the stop layer is regionally uncovered in c).

7. The method according to claim 1, wherein an opening is formed in the planarization layer in a region of the recesses after c).

8. The method according to claim 7, wherein the opening is filled at least regionally by another planarization layer.

9. The method according to claim 8, wherein the planarization layer is electrically insulating and the another planarization layer is electrically conductive.

10. The method according to claim 1, wherein
the semiconductor layer sequence extends in a vertical direction between a first main area and a second main area;
the active region is arranged between a first semiconductor layer and a second semiconductor layer;
the recesses extend from the first main area through the active region into the second semiconductor layer;
the first semiconductor layer is electrically contact-connected from the first main area by a first connection region;
the second semiconductor layer is electrically contact-connected from the first main area by a second connection region; and
the second connection region or an electrical insulation layer between the second connection region and the first semiconductor layer is formed by the planarization layer.

\* \* \* \* \*